(12) United States Patent
Xiao

(10) Patent No.: US 8,421,009 B2
(45) Date of Patent: Apr. 16, 2013

(54) TEST STRUCTURE FOR CHARGED PARTICLE BEAM INSPECTION AND METHOD FOR DEFECT DETERMINATION USING THE SAME

(75) Inventor: Hong Xiao, Pleasanton, CA (US)

(73) Assignee: Hermes Microvision, Inc., Hsinchu (TW)

( * ) Notice: Subject to any disclaimer, the term of this patent is extended or adjusted under 35 U.S.C. 154(b) by 413 days.

(21) Appl. No.: 12/420,224

(22) Filed: Apr. 8, 2009

(65) Prior Publication Data

US 2010/0258720 A1   Oct. 14, 2010

(51) Int. Cl.
*G01N 23/00* (2006.01)

(52) U.S. Cl.
USPC ........................................... 250/307; 250/311

(58) Field of Classification Search ............ 438/17, 438/18; 257/347, 48; 250/307, 311
See application file for complete search history.

(56) References Cited

U.S. PATENT DOCUMENTS

| | | | |
|---|---|---|---|
| 6,452,412 B1 * | 9/2002 | Jarvis et al. | 438/18 |
| 7,474,107 B2 * | 1/2009 | Patterson et al. | 324/754.23 |
| 7,518,190 B2 * | 4/2009 | Cote et al. | 257/347 |
| 7,679,083 B2 * | 3/2010 | Sun et al. | 257/48 |
| 7,732,866 B2 * | 6/2010 | Cote et al. | 257/347 |
| 2007/0221990 A1 * | 9/2007 | Cote et al. | 257/347 |
| 2007/0222470 A1 * | 9/2007 | Patterson et al. | 324/765 |
| 2008/0237586 A1 * | 10/2008 | Sun et al. | 257/48 |
| 2008/0267489 A1 | 10/2008 | Xiao et al. | |
| 2009/0146211 A1 * | 6/2009 | Cote et al. | 257/347 |
| 2010/0055809 A1 * | 3/2010 | Pak et al. | 438/17 |

\* cited by examiner

*Primary Examiner* — Nikita Wells
*Assistant Examiner* — Johnnie L Smith
(74) *Attorney, Agent, or Firm* — Muncy, Geissler, Olds & Lowe, PLLC

(57) ABSTRACT

A test structure and method thereof for determining a defect in a sample of semiconductor device includes at least one transistor rendered grounded. The grounded transistor is preferably located at at least one end of a test pattern designed to be included in the sample. When the test structure is inspected by charged particle beam inspection, the voltage contrast (VC) of the transistors in the test pattern including the grounded transistor is observed for determination of the presence of defect in the sample.

20 Claims, 10 Drawing Sheets

TEST STRUCTURE FOR CHARGED PARTICLE BEAM INSPECTION AND METHOD FOR DEFECT DETERMINATION USING THE SAME

BACKGROUND OF THE INVENTION

1. Field of the Invention

The present invention relates to a test structure and its application for inspecting an electrical device; and more particularly, relates to a test structure and method for detecting sub-threshold voltage defect in an electrical device.

2. Description of the Prior Art

The sub-threshold leakage is a current that flows from the drain to source of a metal-oxide-semiconductor-field-effect-transistor (MOSFET) when the transistor is supposed to be off. When the transistor is turned off or the voltage supplied to the gate of the transistor is lower than its threshold voltage, ideally the conduction between the drain and source should be smaller than a predefined acceptable value, wherein this value is mainly dependent upon the functionality of the device to which the concerned transistor belongs. For example, the threshold value for a device in a microprocessor could be higher than that in a cell phone circuit. In reality, the Boltzmann distribution of electron energies allows some of the more energetic electrons at the source to enter the channel and flow to the drain, resulting in a sub-threshold current. Other causes such as a changed threshold voltage value of a device transistor due to wrongly implanted dopant type or non-uniform dopant distribution would also lead to the occurrence of sub-threshold leakage.

Referring to FIG. 1A which is a schematic illustration of an NMOS transistor 100A without the sub-threshold leakage. As shown, NMOS transistor 100A comprises a gate 101A, an n-type doped region 102A (source) and an n-type doped region 103A (drain) formed on a p-type well 104A and a p-type substrate 105A. A gate voltage Vg is supplied to gate 101A, a drain voltage Vd is applied to drain 103A, and source 102A is grounded. An equivalent circuitry of NMOS transistor 100A is shown as 106A with a gate G, a source S and a drain D. As NMOS transistor 100A does not have sub-threshold leakage, when it is turned off, Vg is equal to zero and there is no current flowing through the channel between source 102A and drain 103A i.e. the drain-to-source current at zero gate voltage, which is denoted as I_off, is equal to zero.

Referring to FIG. 1B, which is a schematic illustration of an NMOS transistor 100B with sub-threshold leakage. As shown, NMOS transistor 100B comprises a gate 101B, an n-type doped region 102B (source) and an n-type doped region 103B (drain) formed on a p-type well 104B and a p-type substrate 105B. A gate voltage Vg is supplied to gate 101B, a drain voltage Vd is applied to drain 103B, and source 102B is grounded. An equivalent circuitry of NMOS transistor 100B is shown as 106B with a gate G, a source S and a drain D. As NMOS transistor 100B has sub-threshold leakage, when it is turned off, Vg again is equal zero but I_off is at this time not equal to zero.

The amount of sub-threshold conduction is set by the threshold voltage of the concerned transistor which sits between ground and the gate voltage (Vg), and so has to be reduced along with the supply voltage. That reduction means less gate voltage swing below threshold to turn the device off, and as sub-threshold conduction varies exponentially with gate voltage, it becomes more and more significant as MOSFETs shrink in size.

Charged particle beam systems such as electron beam inspection (EBI) systems are increasingly utilized in advanced integrated circuit chip manufacturing. The systems have high resolution that can be used to detect tiny physical defects that beyond the capability of optical defect inspection systems. Another advantage of the EBI system is that it can detect, through observation of a voltage contrast (VC) image, defects of electrical circuitry such as open circuit, short circuit or leakage on or underneath the wafer surface. This is based on the fact that semiconductor devices of different configurations give rise to different VC. For example, referring to part (1) of FIG. 2A which illustrates a cross-section of a semiconductor structure 20A. As shown, semiconductor structure 20A comprises an n-type doped region 21A formed in a p-type doped material 22A. As would be understood by those skilled in the art, semiconductor structure 20A may be seen as a diode 23A with a cathode 231A on top of an anode 232A, and with anode 232A being equivalent to being grounded due to its electrical connection to material 22A assuming material 22A has a large enough capacitance. Consequently, when semiconductor structure 20A or a plug connected to it is being scanned on the surface by a positive charging-inducing charged particle beam, diode 23A is inversely biased and positive charges will accumulate on the surface of semiconductor structure 20A or the surface of the plug connected thereto. This will hinder the secondary electrons from the surface of semiconductor structure 20A or its plug from reaching the detector, resulting in a dark voltage contrast (DVC) in the obtained charged particle microscopic image.

Semiconductor structure 20A may be used to form an n-type metal-oxide-semiconductor (NMOS) device 200A as illustrated in part (2) of FIG. 2A. As shown, NMOS device 200A comprises a p-type doped substrate 210A, a p-type doped well 220A, a p-type doped region 230A, heavily n-type doped (N+) source and drain region (S/D) 240A, a very thin layer of gate dielectric 250A, a conducting gate electrode 260A and sidewall spacers 270A. It is noted that well 220A may be dispensed with such that doped region 240A is in direct contact with substrate 210A. Or, in some cases substrate 210A may be so referred to as including well 220A when both of them are of the same dopant type.

Referring to part (1) of FIG. 2B which illustrates a cross-section of a semiconductor structure 20B. As shown, semiconductor structure 20B comprises a p-type doped region 21B formed in an n-type doped material 22B. As would be understood by those skilled in the art, semiconductor structure 20B may be seen as a diode 23B with an anode 231B on top of a cathode 232B, and with cathode 232B being equivalent to being grounded due to its electrical connection to material 22B assuming material 22B has a large enough capacitance. Consequently, when semiconductor structure 20B or a plug connected to it is being scanned on the surface by a positive charging-inducing charged particle beam, diode 23B is forwardly biased. Therefore, electrons from n-type doped material 22B will reach the surface of semiconductor structure 20B or the surface of its plug and positive charges will not accumulate on the surface of semiconductor structure 20B or the surface of its plug but will be drained to ground (material 22B). This will allow more secondary electrons from the surface of semiconductor structure 20B or its plug to reach the detector, resulting in a bright voltage contrast (BVC) in the obtained charged particle microscopic image.

Semiconductor structure 20B may be used to form a p-type metal-oxide-semiconductor (PMOS) device 200B as illustrated in part (2) of FIG. 2B. As shown, PMOS device 200B comprises a p-type doped substrate 210B, a n-type doped well 220B, a n-type doped region 230B, heavily p-type doped (P+) source and drain region (S/D) 240B, a very thin layer of gate dielectric 250B, a conducting gate electrode 260B and sidewall spacers 270B. It is noted that well 220B may be dispensed with such that doped region 240B is in direct contact with substrate 210B. Or, in some cases substrate 210B may be so referred to as including well 220B when both of them are of the same dopant type.

Referring to part (1) of FIG. 2C which illustrates a cross-section of a semiconductor structure 20C. As shown, semiconductor structure 20C comprises a p-type doped region 21C formed in a p-type doped material 22C. As would be understood by those skilled in the art, semiconductor structure 20C may be seen as a resistor 23C which is equivalent to being grounded due to its electrical connection to material 22C assuming material 22C has a large enough capacitance. Consequently, when semiconductor structure 20C or a plug connected to it is being scanned on the surface by a positive charging-inducing charged particle beam, again as in the case in FIG. 2B the positive charges will not accumulate on the surface of semiconductor structure 20C or the surface of its plug but will be drained to ground (material 22C). This will facilitate generation of the secondary electrons from the surface of semiconductor structure 20C or its plug, resulting in a bright voltage contrast (BVC) in the obtained charged particle microscopic image.

Semiconductor structure 20C may be used to form a p-type metal-oxide-semiconductor (PMOS) device 200C as illustrated in part (2) of FIG. 2C. As shown, PMOS device 200C comprises a p-type doped substrate 210C, a p-type doped well 220C, a p-type doped (P+) region 230C, heavily p-type doped (P+) source and drain (S/D) 240C, a very thin layer of gate dielectric 250C, a conducting gate electrode 260C and sidewall spacers 270C. It is noted that well 220C may be dispensed with such that doped region 240C is in direct contact with substrate 210C. Or, in some cases substrate 210C may be so referred to as including well 220C when both of them are of the same dopant type.

As mentioned earlier, charged particle beam inspection can be used to examine presence of varies defects in a fabricated MOSFET by observing the voltage contrast (VC) image thereof. However, the sub-threshold leakage within a static random access memory (SRAM) array is not easy to be inspected by charged particle beam inspection such as EBI, because the scanning charged particle beam gives rise to an equal surface charging (thus surface potential) to plugs with a similar underneath connected electrical devices. In other words, there would be no bias voltage between the source and drain of a MOSFET to which the scanned plugs are connected. As a result, even the sub-threshold leakage exceeds the acceptable conduction current value at designated drain voltage Vd, both the normal and defective source/drain plugs look the same in the obtained charged particle voltage contrast image. For example, they may both display a dark voltage contrast (DVC). This makes it difficult to identify the defective MOSFET which has sub-threshold leakages.

Accordingly, test structures and application method thereof are needed to facilitate charged particle beam-based inspection of the sub-threshold leakage.

SUMMARY OF THE INVENTION

In one embodiment, a test structure for testing sub-threshold voltage leakage of SRAM device is disclosed by minor modification of a conventional SRAM device.

A test structure and a method for determining a defect in a sample of semiconductor device are directed to at least one transistor in the sample of semiconductor device rendered grounded. The grounded transistor set in the test pattern by electrically conducting the transistor to be grounded and a substrate or a capacitor of high volume capacitance.

A test structure and a method for determining a defect in the sample of semiconductor device are directed to at least one transistor rendered grounded by allowing electrical conduction between a doped region of the transistor to be grounded and a substrate or a capacitor of high volume capacitance. The grounded transistor is located at the end of a test pattern.

A test structure and a method for determining a defect in the sample of semiconductor device are directed to create source-to-substrate short by modifying source/drain ion implantation mask for the fabrication of MOSFETs in a semiconductor device. The condition of source-to-substrate short renders some plug grounded. The surface potential of grounded plug will be close to zero value while the surface potential of other plugs connected to normal source/drain regions are at a positive value during positive mode EBI. Thus, a bias between the source and drain will be created, and the detection of sub-threshold leakage will be shown as a bright voltage contrast (BVC).

Accordingly, a method for determining a defect in a sample of semiconductor device comprises the steps of providing the sample with at least one test pattern, wherein at least one transistor in the test pattern is rendered grounded; obtaining a charged particle microscopic image of the sample; and determining the defect in the sample by monitoring the voltage contrast (VC) level of the transistors in the test pattern from the charged particle microscopic image.

Accordingly, a test structure for determining a defect of a semiconductor device comprises at least one test pattern and at least one transistor in the test pattern is rendered grounded. The defect is determined by monitoring the voltage contrast (VC) level of the transistors in the test pattern from a charged particle microscopic image of the sample.

Other advantages of the present invention will become apparent from the following description taken in conjunction with the accompanying drawings wherein are set forth, by way of illustration and example, certain embodiments of the present invention.

DETAILED DESCRIPTION OF EXAMPLE EMBODIMENTS

Figure 1A:
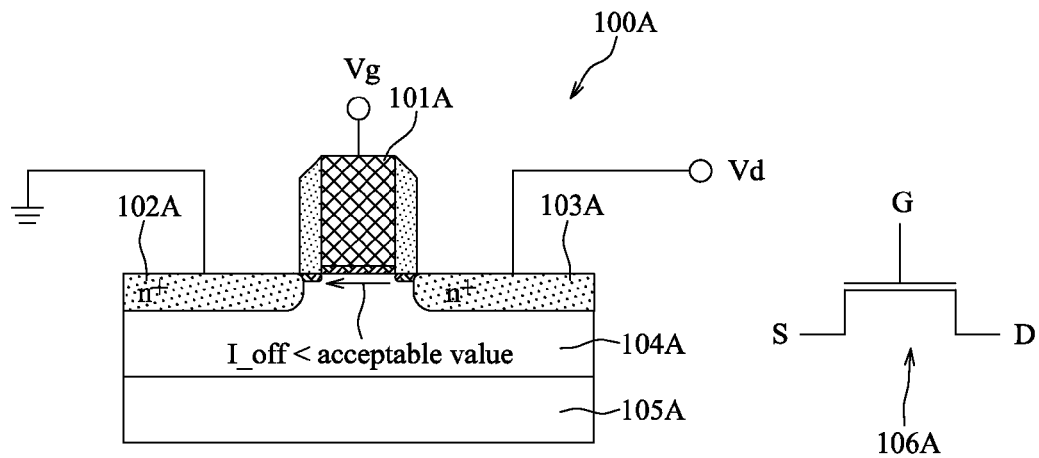
FIG. 1A is a schematic illustration of an NMOS transistor without the sub-threshold leakage.
Figure 1B:
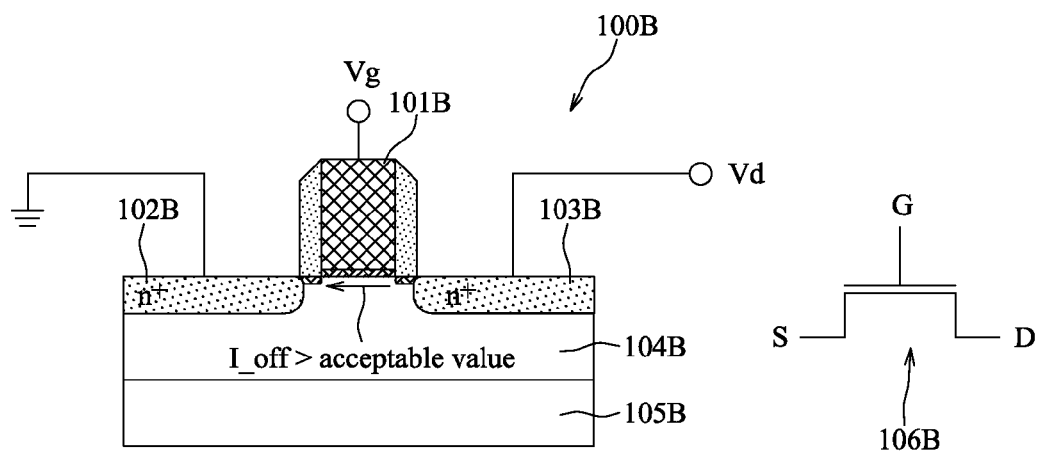
FIG. 1B is a schematic illustration of an NMOS transistor with sub-threshold leakage.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

A charge particle beam system may be, for example, an electron beam system. Examples of a conventional charge particle beam system may be seen in U.S. Patent Publication No. 20080267489 and will not be repeated herein. A test structure is intentionally designed to be defective. Charged particle microscopic images of such defective devices can be used as a reference for comparison with that of a fabricated device for determining the presence of a defect therewithin.

During charged particle beam inspection, the scanning charged particle beam either scans a contact plug or its extension plugs exposing on the surface of the semiconductor device being examined. When plugs with different underneath connected electrical devices are scanned, different voltage contrast (VC) images may be observed. On the contrary, if two plugs with substantially identical underneath connected electrical devices are scanned, substantially the same charging will be accumulated on the surface plugs, resulting in the same potential thus the same VC for these scanned plugs in the obtained charged particle microscopic images. This behavior leads to problems in examining the sub-threshold leakage in a SRAM device using charged particle beam inspection technique, because a typical SRAM has many identical electrical devices, for example NMOS transistors, therewithin, and when these transistors or their extension plugs are scanned by the charging-inducing beam, equal potential will be caused to individual source/drain doped regions. In other words, there will no voltage bias across the channel between the source/drain doped regions within a scanned transistor. As result, even if there is a sub-threshold leakage defect present, it will not show in the obtained image in the form of an abnormal VC (for example a BVC) because there is no driving force to form and cause an electrical current to flow across the channel with equal voltage potential on both sides.

A typical SRAM device includes a matrix of addressable memory cells arranged in columns and rows. A typical 6-transistor SRAM cell includes two access transistors (NMOS) and a flip-flop formed with two cross-coupled inverters, each inverter having a pull-down (NMOS) transistor and a push-up (PMOS) transistor. The gates of the access transistors in each row are connected to a word line and the sources of each of the access transistors in each column are connected to either one of a bit line pair. Peripheral circuitry associated with the rows (or word lines) and peripheral circuitry associated with the columns (or bit lines) facilitate reading data from, and writing data to, the SRAM cells.

Figure 3A:
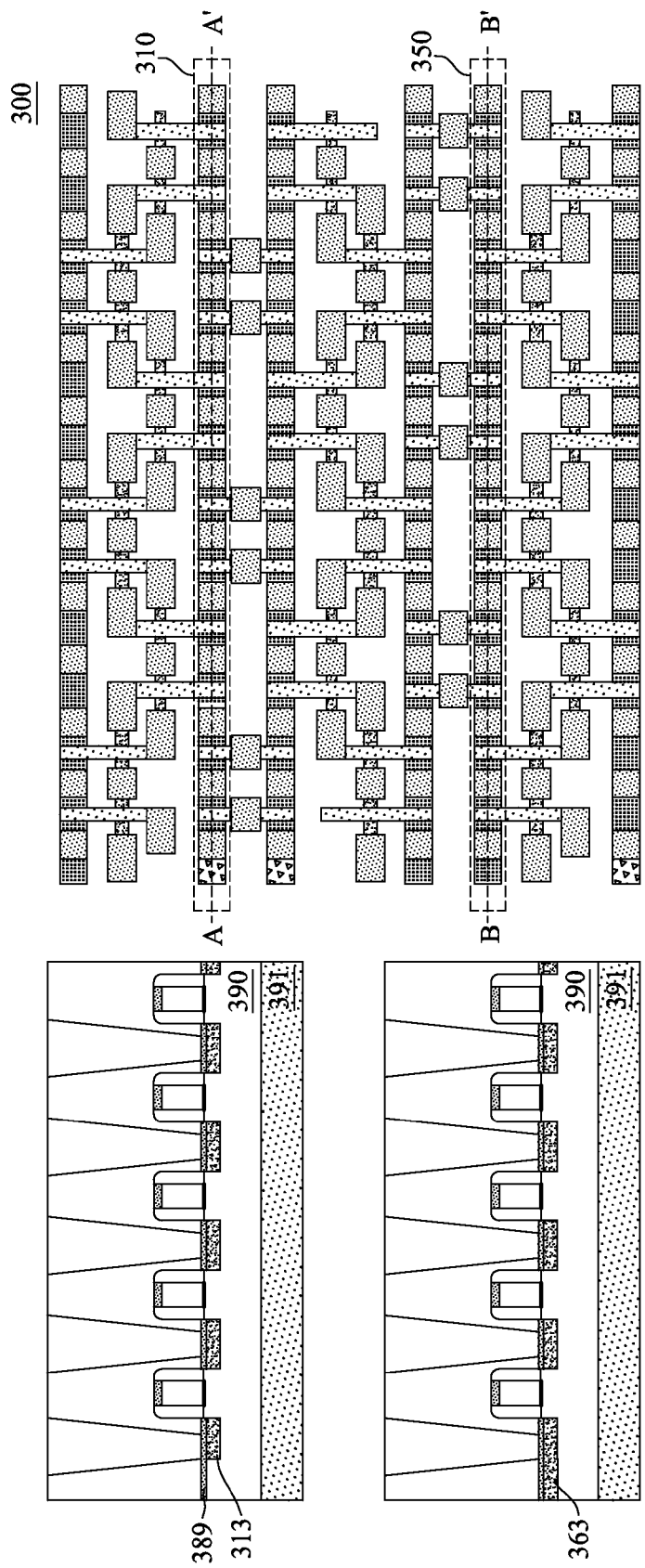
FIG. 3A is a schematic illustration of the design of a test structure for sub-threshold leakage detection in accordance with an embodiment of the present invention.

In one embodiment, a test structure for detecting the sub-threshold leakage within an SRAM device is disclosed. Referring to FIG. 3A, which is a schematic illustration of the design of a test structure 300 for sub-threshold leakage detection in accordance with an embodiment of the present invention. The right hand side drawing is a top view schematic of test structure 300, while the left hand side drawings are a cross sectional schematic of two different patterns in test structure 300. As shown, test structure 300 comprises a similar layout to a general SRAM device. Test structure 300 mainly differs from a general SRAM device in that it has a test pattern 310. Test pattern 310 is designed to have a short defect at at least one of its ends. The left hand side drawings are cross sectional illustrations of the defective test pattern 310 (along line A-A') and a normal pattern 350 (along line B-B'). As shown in the left hand side drawings, a source-to-ground short defect is intentionally formed at one end of test pattern 310 in the form of a shorter doped region 313, while normal pattern 350 has a full-size doped region 363 i.e. no source-to-ground short is present for normal pattern 350. As a result, conduction is allowed between the shorted doped region 313 and an underneath substrate material (390, 391) of test pattern 310 through a conductive layer 389, thereby rendering doped region 313 grounded. No such conduction is, however, allowed for the full-size doped region 363 of normal pattern 350 because the conductive layer 389 in normal pattern 350 is never in contact with the underneath substrate material (390, 391). Details of the cross sectional schematics will be described below. It is noted that conductive layer 389 is a common element in a semiconductor device such as a field effect transistor (FET) device. In one embodiment, it may be a silicide layer.

Figure 3B:
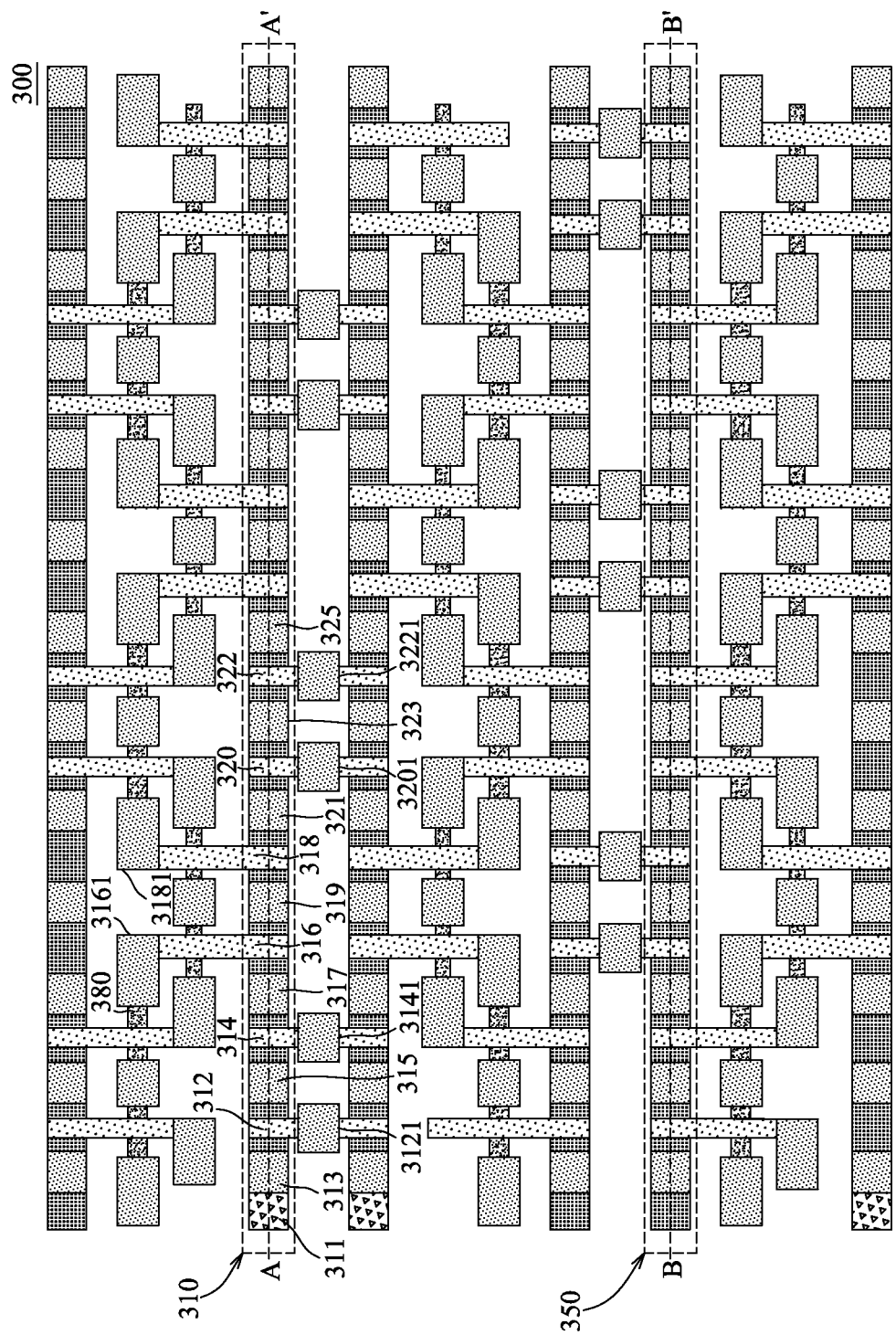
FIG. 3B is a top view schematic illustration of the test structure in FIG. 3A.

Referring to FIG. 3B, which is a top view schematic illustration of test structure 300 in FIG. 3A. As mentioned earlier, test structure 300 differs from a general SRAM device in that it has test pattern 310. Test pattern 310 is designed to have a short defect 311 at either one or both of its ends. As shown, short defect 311 is an un-doped region abutting an end doped region 313 of test pattern 310. During charged particle beam inspection (such as EBI), this short defect 311 renders a voltage bias across the channel between source/drain doped regions 313 and 315 underneath a gate 312, wherein gate 312 together with dope regions 313 and 315 form a transistor, with doped region 313 serving as a source and doped region 315 serving as a drain, respectively. It is noted that in FIG. 3B, the squares and rectangles represent a conducting plug extending from certain underneath electrical devices. Drawing signs for these squares/rectangles may be referring to the plug itself or the electrical device underneath as well. For example, 313, 315, etc. are referring to the underneath doped regions. In addition, 312, 314, etc are referring to the gate rather than just the conducting gate electrode (the vertical stripe at which signs 312, 314 are pointing). Therefore, the drawing signs in FIG. 3B should be understood in conjunction with the text descriptions, so as to keep the readers from being confused and/or misled.

Figure 3C:
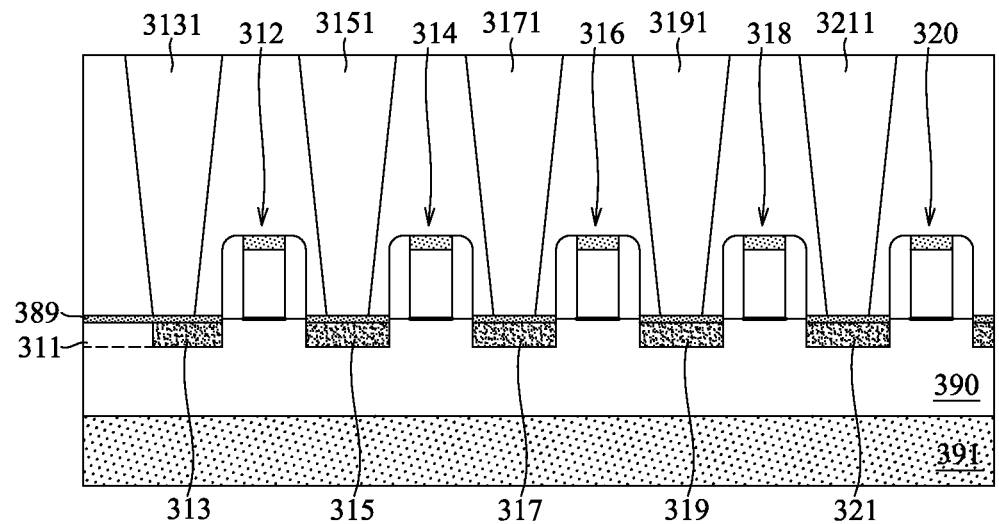
FIG. 3C is a schematic illustration of the transistors within the test pattern in FIG. 3A.

Referring to FIG. 3C, which is a schematic illustration of the transistors within test pattern 310 in FIG. 3A. FIG. 3C is a cross-sectional view along line A-A' in FIG. 3B. As shown, gates 312, 314, 316, 318, 320, etc. are formed on a doped well 390 and a doped substrate 391 with source/drain doped regions 313, 315, 317, 319, 321, etc. formed by the side of individual gates 312, 314, 316, 318, 320, etc. and embedded in well 390. Doped region 313 abuts short defect 311 which is implemented as an un-doped region. In addition, doped region 313 and short defect 311 are commonly covered by a conductive layer 389. As a result, conduction is allowed between doped region 313 and well 390 through conductive layer 389, thereby rendering doped region 313 virtually shorted to ground (or say to substrate 391 assuming substrate 391 has a large enough capacitance that its potential is not affected by the charging induced by charged particle beam inspection). In one embodiment, well 390 is dispensed with and conduction is allowed directly between doped region 313 and substrate 391.

Contact plugs 3131, 3151, 3171, 3191, 3211, etc. are formed on top of respective source/drain doped regions 313, 315, 317, 319, 321, etc. extending upwards. Plugs connected to gates 312, 314, 316, 318, 320, etc. are not shown in FIG. 3C because these gate plugs are not located on the drawing plane. Referring back to FIG. 3B, gate 312 is connected to a gate plug 3121 through a conducting gate electrode (the vertical stripe at which sign 312, 314 are pointing, as mentioned earlier). Also, gate 314 is connected to a gate plug 3141 in the similar way.

Figure 2A:
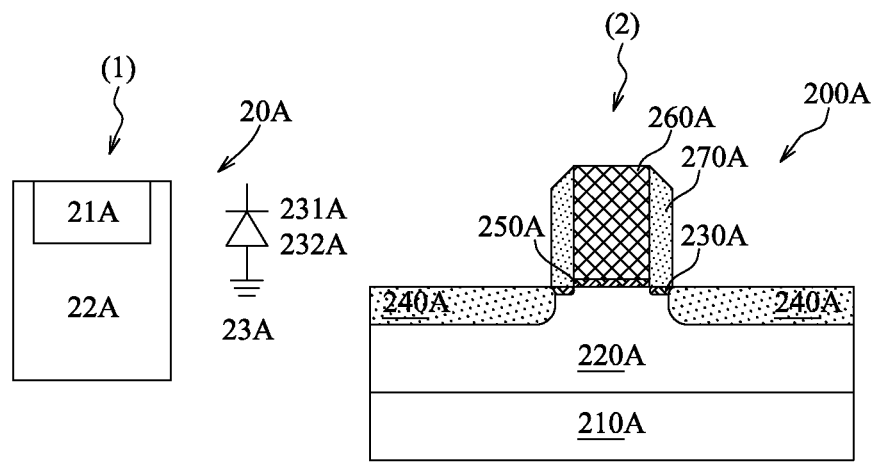
FIG. 2A is a schematic illustration of (1) a semiconductor structure 20A; and (2) an NMOS device 200A formed from semiconductor structure 20A.
Figure 2B:
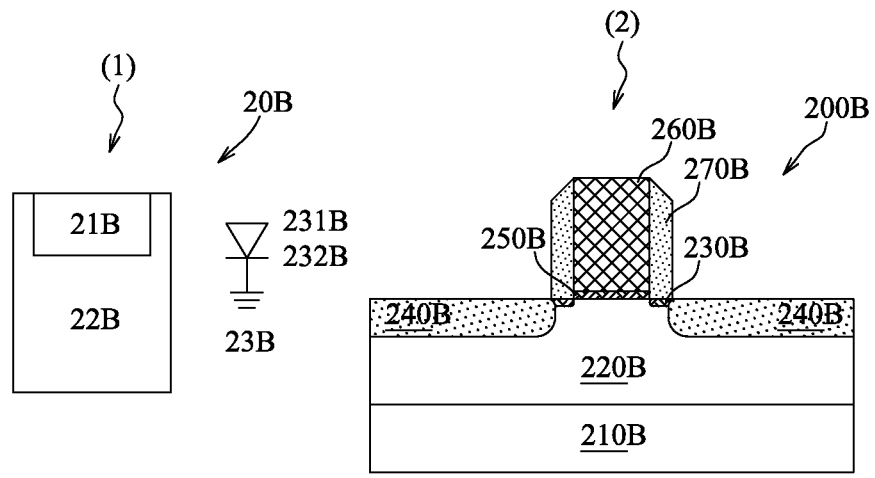
FIG. 2B is a schematic illustration of (1) a semiconductor structure 20B; and (2) a PMOS device 200B formed from semiconductor structure 20B.
Figure 2C:
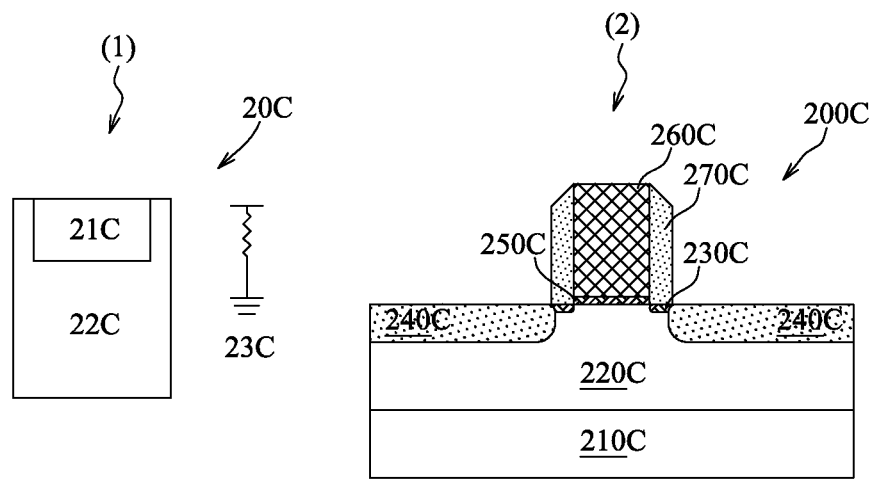
FIG. 2C is a schematic illustration of (1) a semiconductor structure 20C; and (2) a PMOS device 200C formed from semiconductor structure 20C.

It is noted that as shown in FIG. 3B gate 316 is connected to a share contact plug 3161 through its gate electrode, and share contact plug 3161 is additionally connected to a semiconductor structure 380. Similarly, gate 318 is connected to a share contact plug 3181 which is connected to another semiconductor structure 380. In a typical SRAM device, gate 312 and 314 generally function as a pass gate, and 316 and 318 generally function as an inverter gate. With such arrangement, in one embodiment, gate 312 and 314 are implemented on an NMOSFET structure, and semiconductor structure 380 is implemented as a PMOSFET structure, wherein the NMOSFET structure may be implemented using semiconductor structure 20A (N+/P-well) in FIG. 2A, and the PMOS structure may be implemented using semiconductor structure 20B (P+/N-well) or 20C (P+/P-well) in FIG. 2B and 2C.

For example, well 390 may comprise a p-type doped well, substrate 391 may comprise a p-type doped substrate, and doped regions 313, 315, 317, 319, 321 may comprise n-type doped regions. In other words, test pattern 310 is implemented in a form of an NMOSFET such as that illustrated in conjunction with FIG. 2. Therefore, as described earlier, since doped region 313 is shorted to the ground by short defect 311, when plug 3131 or its extension plug is scanned on the surface by a positive charging-inducing charged particle beam, the (positive) surface charging will be drained to ground (substrate 391) and will not be able to accumulate on the surface of plug 3131 or its extension plugs. On the contrary, as doped regions 315, 317, 319, 321, etc. are not shorted to the ground, when plugs 3151, 3171, 3191, 3211 or their extension plugs are scanned on the surface by a positive charging-inducing charged particle beam, a positive charging will accumulate on the plug surface, resulting in a substantially equal potential for individual doped regions 315, 317, 319, 321, etc. A source-to-drain voltage bias is thus formed between doped regions 313 and 315. A driving force for charged carriers to flow from doped regions 317, 319, 321, etc. to the ground (substrate 319) is thus provided.

Meanwhile, when gate plugs 3121, 3141 in FIG. 3B or their extension plugs are scanned on the surface by a positive charging-inducing charged particle beam, a positive charging will accumulate on the plug surface, resulting in a potential on gates 312, 314. With the existence of source-to-drain bias between doped region 313 and 315, if this gate potential (or say gate voltage) exceeds a threshold value for gate 312, the channel underneath gate 312 will turn on, allowing an electrical current to flow through the channel between doped region 313/311 and 315, and eventually to the ground (substrate 391). This will make plug 3131 and 3151 (or their extension plugs) to display a bright voltage contrast (BVC) in the obtained charged particle microscopic image. Test structure 300 can now be used to examine the presence of a sub-threshold leakage defect by observing the voltage contrast image of test pattern 310.

Figure 4A:
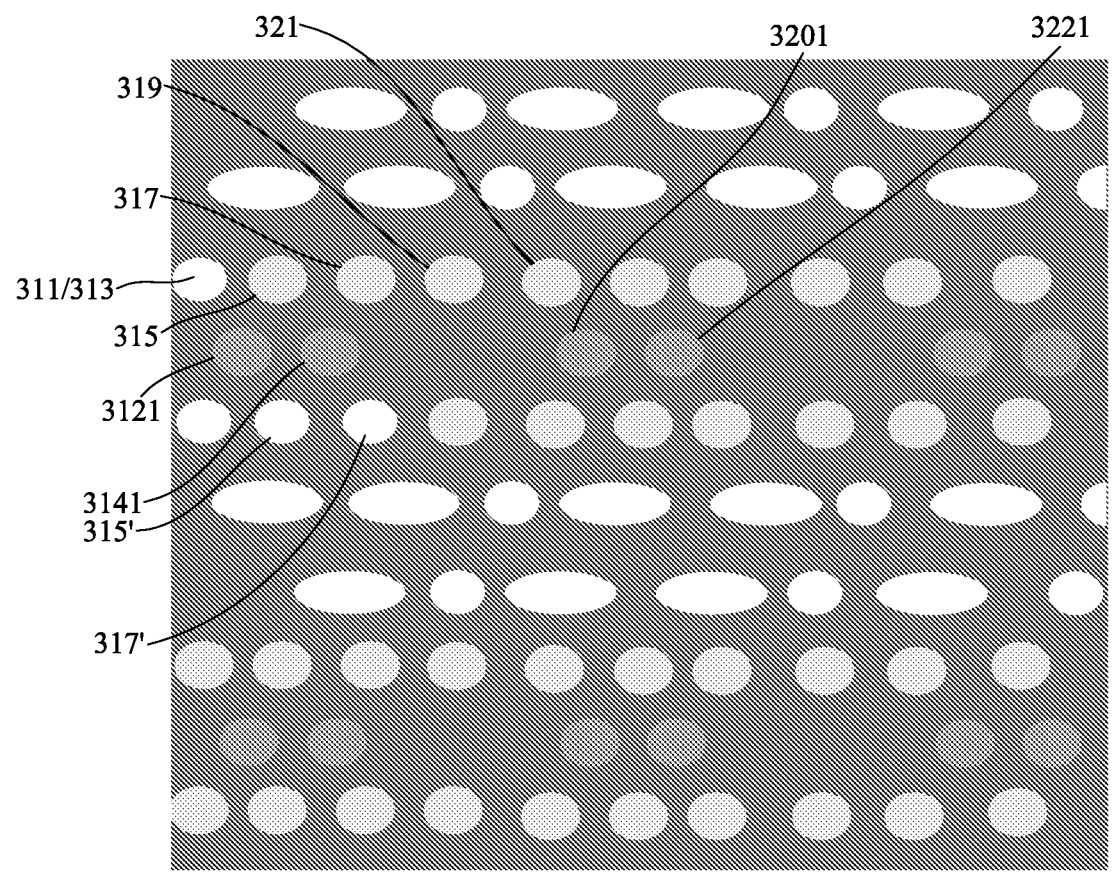
FIG. 4A is a charged particle beam microscopic image of a test structure without sub-threshold leakage in accordance with an embodiment of the present invention.

Referring to FIG. 4A, which is a charged particle beam microscopic image of a test structure 300 without sub-threshold leakage in accordance with an embodiment of the present invention. As shown, source/drain doped regions 313 (including the contacting short defect 311), 315 and 317 display a BVC, while doped regions 319 and 321, etc. display a DVC. Or say, plugs 3131, 3151 and 3171 in FIG. 3C display a BVC, while plugs 3191 and 3211, etc. in FIG. 3C display a DVC. In the mean time, gate plugs 3121 and 3141 display a DVC, and gate plugs 3201 and 3221 (as also shown in FIG. 3B) also display a DVC. In this embodiment, the scanning-induced positive charging accumulates on plugs 3131, 3151, 3171, 3191, 3211, etc. In addition, the charging also accumulates on gate plugs 3121 and 3141. It is noted that as shown in FIG. 4A, source/drain doped regions (or say their plugs) 315, 317 display a DVC, while their corresponding plugs 315', 317' display a BVC. This is because during inspection, test pattern 310 is scanned starting from the top, therefore the upper plugs 315 and 317 are scanned first, before the gates plug 3141 is scanned. Therefore, when plugs 315 and 317 are scanned there is no scanning-induced gate voltage on gate 314, and the channel underneath gate 314 is not turned on. As a result, no current flows from doped region 317 to 315, rendering a DVC for these doped regions. On the other hand, when plug 315' and 317' are scanned, the scanning-induced charging has already accumulated on gate plug 3141, resulting a gate voltage on gate 314 which is sufficient to turn on the underneath channel. Therefore, a current is allowed to flow from doped region 317' to 315', rendering a BVC for there doped regions.

For doped regions 313/311, 315, 317, as charging is able to accumulate on gates 312 and 314, it can be viewed as that a gate voltage which is larger than the threshold voltage for gate 312 and 314 is being supplied to gate 312 and 314, respectively. In addition, the positive charging would also accumulate on the NMOS doped regions 313/311, 315 and 317 or say corresponding plugs 3131, 3151 and 3171, giving rise to a potential on individual plugs which is substantially the same as one another due to the substantially identical underneath connected electrical devices of these plugs. However, the source-to-ground short defect 311 causes doped region 313 to have a ground voltage, thereby allowing a voltage bias across the channel between doped regions 313 and 315 and the one between doped regions 315 and 317. As a result, a current is able to flow from doped region 315 to 313 and then to the ground (i.e. substrate 391 in FIG. 3B) through short defect 311. This in turn attracts charge carriers to flow, from doped region 317, through the channel between dope region 315 and 317 to dope region 315, and then through the channel between doped region 313 and 315 and eventually to the ground. Therefore, doped regions 313, 315, and 317 display a BVC.

As for doped region 319 and 321 (or say plugs 3191 and 3211), because most of the accumulated surface charging on gate 316 and 318 is drained to the ground (semiconductor structure 380) through plug 3161 and 3181, respectively, the gate voltage remaining on gate 316 and 318 is lower than the threshold voltage of gate 316 and 318. As a result, the channel between doped region 319 and 321 is not turned on, and no or little current is able to flow across the channel between doped regions 317, 319 and 321. Therefore, doped regions 319, 321, etc., or say plugs 3191, 3211, etc., display a DVC.

It is noted that the above voltage contrast behaviors of doped regions 313/311, 315, 317, arise from the nature of the NMOS structure of these doped regions, and are not affected by the presence of a sub-threshold leakage defect in test structure 300. The VC behavior of dope regions 319 and 321 however, would be different if there is a sub-threshold leakage in test structure 300.

Figure 4B:
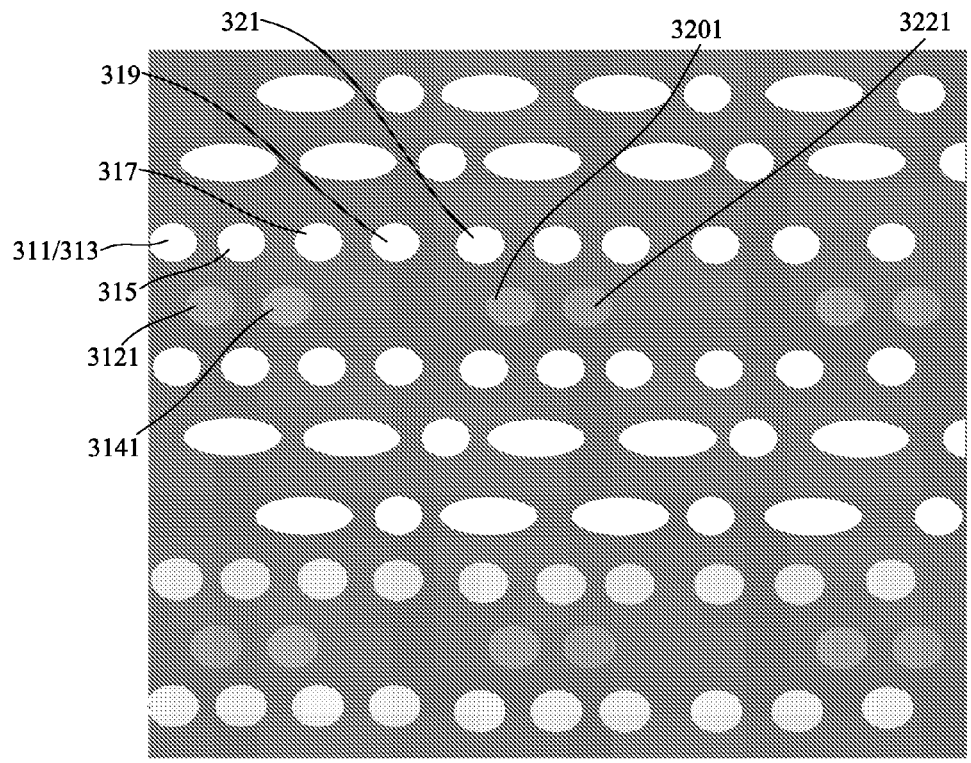
FIG. 4B is a charged particle beam microscopic image of a test structure with sub-threshold leakage in accordance with an embodiment of the present invention.

Reference will now be made to FIG. 4B, which is a charged particle beam microscopic image of a test structure 300 with sub-threshold leakage in accordance with an embodiment of the present invention. As illustrated in FIG. 4B, doped regions 313/311, 315 and 317 display a BVC. Further, gate plug 3121 and 3141 display a DVC, and gate plug 3201 and 3221 also display a DVC. These elements display the same VC as in FIG. 4A, where no sub-threshold leakage defect is present. Doped regions 319, 321, etc. however, display a BVC in this case. This is because the existing sub-threshold leakage defect allows an electrical current to flow across the channel between doped regions 317, 319 and 321 even when the gate voltage on gate 316/318 is lower than its threshold voltage. It should be noted that the sub-threshold leakage typically exists as a systematic defect, therefore when it is present in test structure 300 most of the doped regions therewithin would be defective and the entire row of transistors in test pattern 310 may be observed to be displaying a BVC. As a result, from the inspection point of view, if the number of the consecutive doped regions (or say the plugs connected thereto) in test pattern 310 display an abnormal VC (BVC in this case) exceeds a predefined threshold value, it is determined that a sub-threshold leakage defect is present in test structure 300.

As would be understood by those skilled in the art, gates 316 and 318 are "virtually" grounded by being connected to the P+/N-well, P+/P-well (or N+/N-well) semiconductor structure 380. The nature of semiconductor structure 380 allows the charging induced by charged particle beam inspection on share contact plugs 3161 and 3181 to be drained to ground (semiconductor structure 380), such that only a small amount charging remains on gates 316 and 318 (~0.7V). Since such potential is typically smaller than the threshold voltage of gate 316 and 318, a grounding effect is achieved. However, as semiconductor devices shrink in size, the threshold voltage thereof is continuously being lowered as well. With such a trend, it is possible to encounter scenarios where the threshold voltage for gate 316 and 318 goes below 0.7V, and when this happen, the channel between doped regions 317, 319 and 321 will turn on as a result of charged particle beam inspection of test structure 300, and an electrical current will flow through the channel. Doped regions 319 and 321 will thus display a BVC in the obtained charged particle microscopic image whether a sub-threshold leakage defect exists in test structure 300 or not. The original design idea of test structure 300 to examine the presence of sub-threshold leakage thus fails. To overcome such problem, modification must be made to test structure 300 to further bring down the charging that would remain on share contact plug 3161 and 3181 (thus gate 316 and 318) such that the voltage on gate 316 and 318 is ensured to be below their threshold voltages.

Figure 5A:
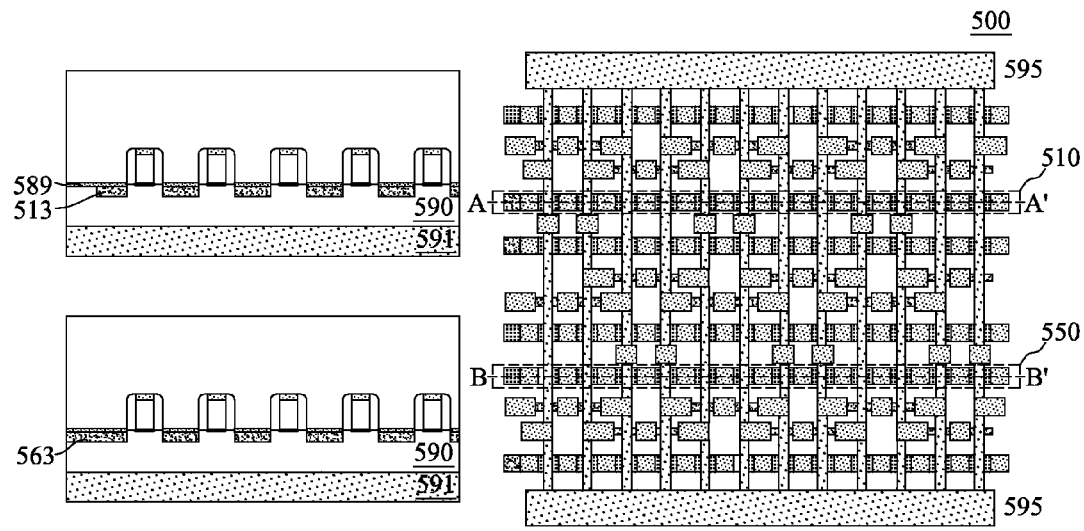
FIG. 5A is a schematic illustration of the design of a test structure for sub-threshold leakage detection in accordance with an embodiment of the present invention.

Referring to FIG. 5A, which is a schematic illustration of the design of a test structure 500 for sub-threshold leakage detection in accordance with an embodiment of the present invention. The right hand side drawing is a top view schematic of test structure 500, while the left hand side drawings are a cross sectional schematic of two different patterns in test structure 500. Test pattern 510 is designed to have a short defect at at least one of its ends. The left hand side drawings are cross sectional illustrations of the defective test pattern 510 (along line A-A') and a normal pattern 550 (along line B-B'). As shown, a source-to-ground short defect is intentionally formed at one end of test pattern 510 in the form of a shorter doped region 513, while normal pattern 550 has a full-size doped region 563 i.e. no source-to-ground short is present for normal pattern 550. As a result, conduction is allowed between the shortened doped region 513 and an underneath substrate material (590, 591) of test pattern 510 through a conductive layer 589, thereby rendering doped region 513 grounded. No such conduction is, however, allowed for the full-size doped region 563 of normal pattern 550 because the conductive layer 589 in normal pattern 550 is never in contact with the underneath substrate material (590, 591). Details of the cross sectional schematics will be described below. It is noted that conductive layer 589 is a common element in a semiconductor device such as a field effect transistor (FET) device. In one embodiment, it may be a silicide layer.

Further, as shown, in this embodiment a plurality of long poly lines are used to electrically connect some of the transistor gates in test structure 500 (or at least those in test pattern 510) to a plurality of pads 595 to ensure a ground voltage for these concerned gates during charged particle beam inspection. Pads 595 are designed to have a large capacitance such that, once the concerned gates are connected to these pads their potential will no longer be affected by the charging induced by charged particle beam inspection. In other words, by being connected to pads 595, the concerned gates are provided with a strong grounding effect. The gate potential of these concerned gates, for example gates 516 and 518, may then be substantially equal to zero during charged particle beam inspection of test structure 500. In one embodiment, the gates and pads 595 in test structure 500 may be formed through self-aligned double patterning process by skipping the second (the end cut) mask.

Figure 5B:
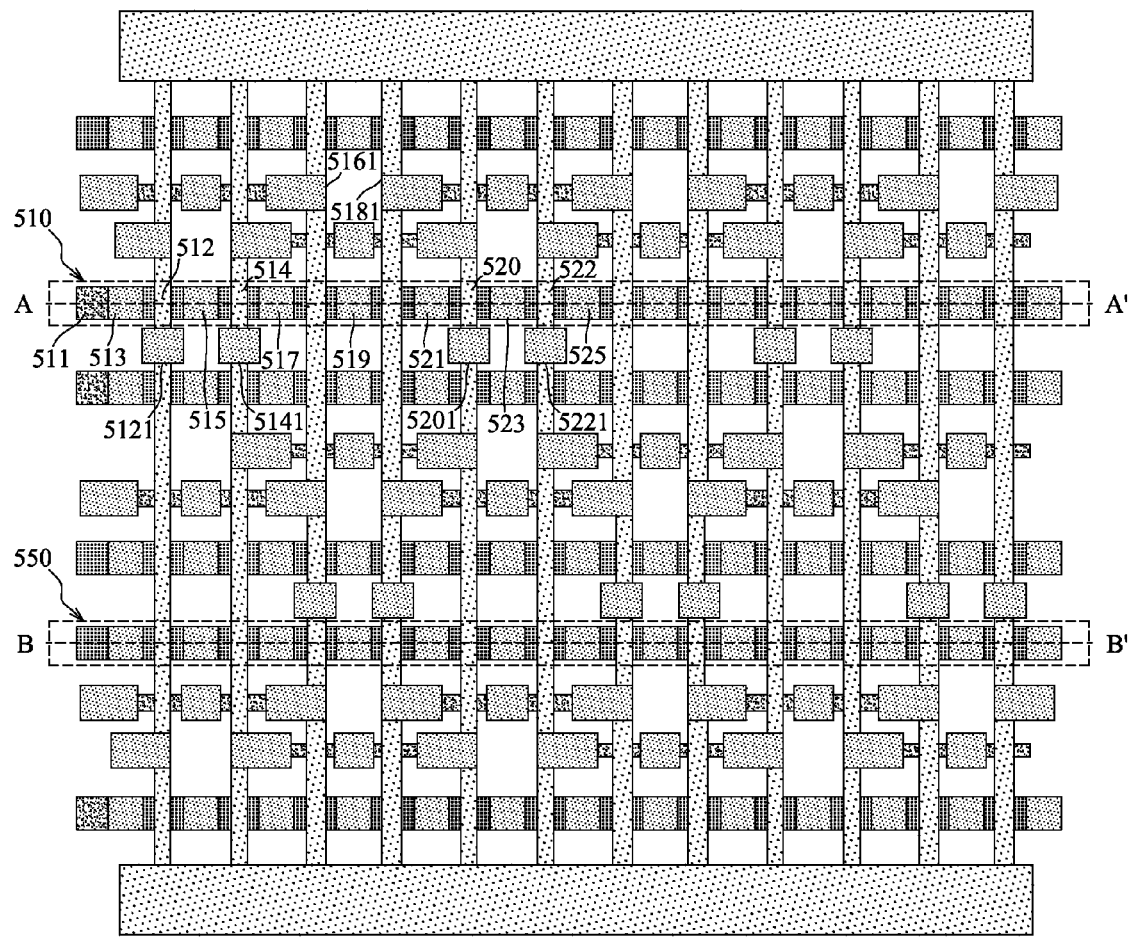
FIG. 5B is a top view schematic of the test structure in FIG. 5A.

Referring to FIG. 5B, which is a top view schematic illustration of test structure 500 in FIG. 5A. Again as mentioned earlier, test structure 500 mainly differs from a general SRAM device in that it has test pattern 510. Test pattern 510 is designed to have a short defect 511 at either one or both of its ends. As shown, short defect 511 is an un-doped region abutting an end doped region 513 of test pattern 510. During charged particle beam inspection (such as EBI), this short defect 511 renders a voltage bias across the channel between source/drain doped regions 513 and 515 underneath a gate 512, wherein gate 512 together with dope regions 513 and 515 form a transistor, with doped region 513 serving as a source and doped region 515 serving as a drain, respectively. It is noted that in FIG. 5B, again as the case in FIG. 3B, the squares and rectangles represent a conducting plug extending from certain underneath electrical devices. Therefore, the drawing signs in FIG. 5B again should be understood in conjunction with the text descriptions, so as to keep the readers from being confused and/or misled.

Figure 5C:
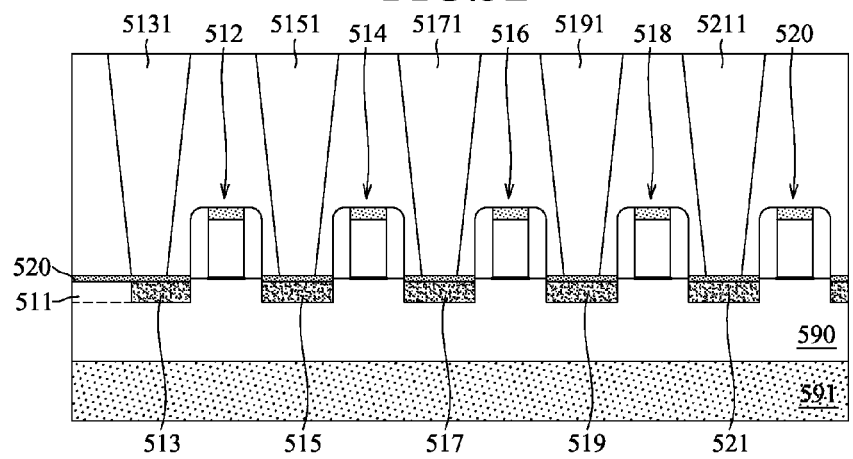
FIG. 5C is a schematic illustration of the transistors within test pattern in FIG. 5A.

Referring to FIG. 5C, which is a schematic illustration of the transistors within test pattern 510 in FIG. 5A. FIG. 5C is a cross-sectional view along line A-A' in FIG. 5B. As shown, gates 512, 514, 516, 518, 520, etc. are formed on a doped well 590 and a doped substrate 591 with source/drain doped regions 513, 515, 517, 519, 521, etc. formed by the side of individual gates 512, 514, 516, 518, 520, etc. and embedded in well 590. Doped region 513 abuts short defect 511 which is implemented as an un-doped region. In addition, doped region 513 and short defect 511 are commonly covered by a conductive layer 589. As a result, conduction is allowed between doped region 513 and well 590 through conductive layer 589, thereby rendering doped region 513 virtually shorted to ground (or say to substrate 591 assuming substrate 591 has a large enough capacitance). In one embodiment, well 590 is dispensed with and conduction is allowed directly between doped region 513 and substrate 591.

Contact plugs 5131, 5151, 5171, 5191, 5211, etc. are formed on top of respective source/drain doped regions 513, 515, 517, 519, 521, etc. extending upwards. Plugs connected to gates 512, 514, 516, 518, 520, etc. are not shown in FIG. 5C because these gate plugs are not located on the drawing plane. Referring back to FIG. 5B, gate 512 is connected to a gate plug 5121 through a conducting gate electrode (the vertical stripe at which sign 512, 514 are pointing). Also, gate 514 is connected to a gate plug 5141 in the similar way.

For example, well 590 may comprise a p-type doped well, substrate 591 may comprise a p-type doped substrate, and doped regions 513, 515, 517, 519, 521 may comprise n-type doped regions. In other words, test pattern 510 is implemented in a form of an NMOSFET such as that illustrated in conjunction with FIG. 2. In such case, since doped region 513 is shorted to the ground by short defect 511, when plug 5131 or its extension plug is scanned on the surface by a positive charging-inducing charged particle beam, the (positive) surface charging will be drained to ground (substrate 591) and will not be able to accumulate on the surface of plug 5131 or its extension plugs. On the contrary, as doped regions 515, 517, 519, 521, etc. are not shorted to the ground, when plugs 5151, 5171, 5191, 5211 or their extension plugs are scanned on the surface by a positive charging-inducing charged particle beam, a positive charging will accumulate on the plug surface, resulting in a substantially equal potential for individual doped regions 515, 517, 519, 521, etc. A source-to-drain voltage bias is thus formed between doped regions 513 and 515. A driving force for charged carriers to flow from doped regions 517, 519, 521, etc. to the ground (substrate 519) is thus provided.

Different from the case of test structure 300, when test structure 500 is scanned by a positive charging-inducing charged particle beam, gate plugs 5121, 5141, and share contact plugs 5161, 5181 all display a BVC in the obtained image. This is because these gates are all now grounded, thus charging can not build up on the surface of a plug electrically connected to them but drained to the ground, facilitating the generation of the secondary electrons.

Figure 6A:
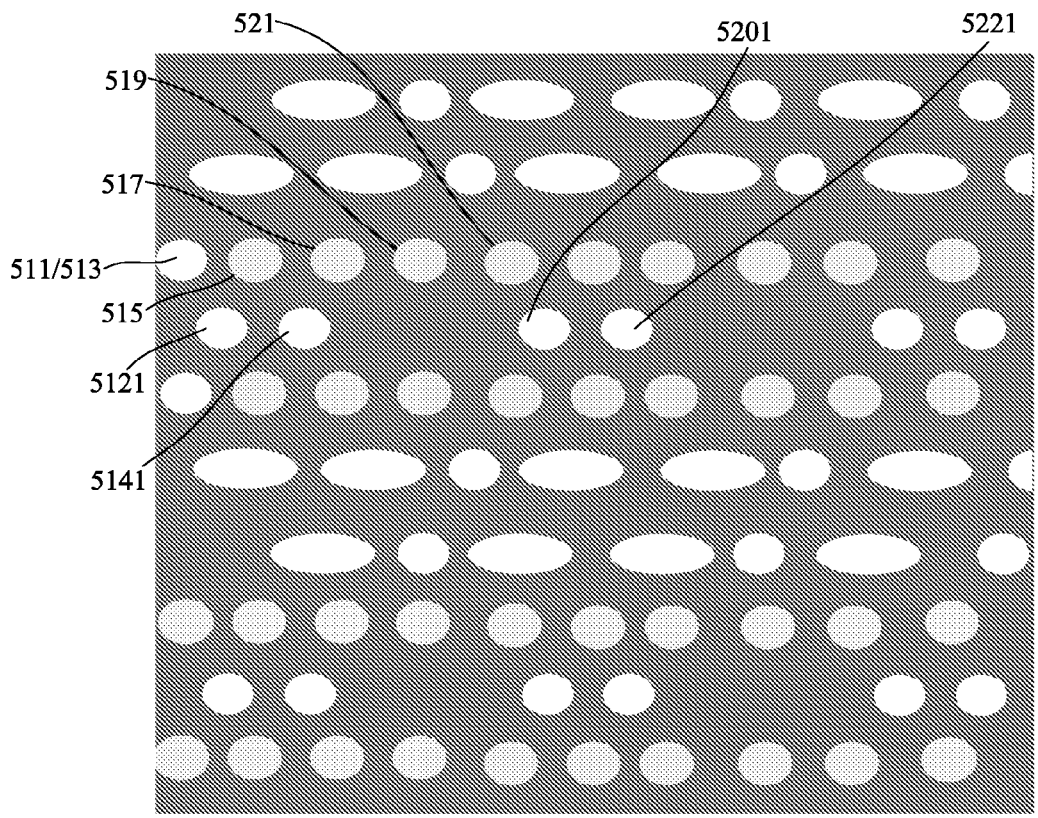
FIG. 6A is a charged particle beam microscopic image of a test structure without sub-threshold leakage in accordance with an embodiment of the present invention.

Referring to FIG. 6A, which is a charged particle beam microscopic image of a test structure 500 without sub-threshold leakage in accordance with an embodiment of the present invention. Recall that in this embodiment, test structure 500 is designed to render gates 512, 514, 520, 522, etc. grounded by having them electrically connected to pads 595, such that the gate potential/gate voltage on gate 512, 514, 520, 522, etc. would be lower than their corresponding threshold voltages during charged particle beam inspection. For example, this concerned gate voltage may be substantially equal to zero (ground voltage) during charged particle beam inspection. Therefore, as shown in FIG. 6A, gate plugs 5121, 5141, 5201 and 5221 (as also shown in FIG. 5B) all display a BVC. The channels under these gates do not turn on, and as there is no sub-threshold leakage present in test structure 500, no electrical current is thus allowed to flow across the channels between doped region 513, 515, 517, 519, 521, etc., rendering a DVC for these doped regions. Doped region 513/511 on the other hand, as is shorted (grounded), displays a BVC. Alternatively speaking, the grounded plug 5131 in FIG. 5C displays a BVC, while other non-grounded plugs 5151, 5171, 5191, 5211, etc. in FIG. 5C display a DVC.

Figure 6B:
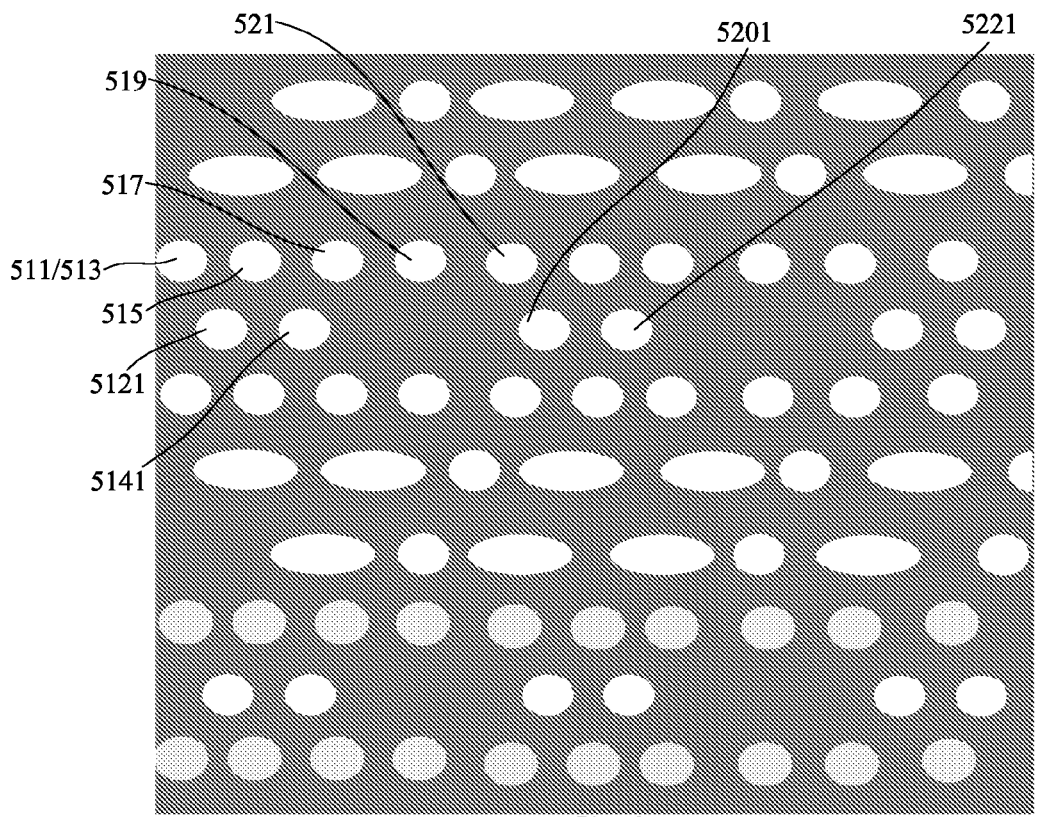
FIG. 6B is a charged particle microscopic image of a test structure with sub-threshold leakage in accordance with an embodiment of the present invention.

Reference will now be made to FIG. 6B, which is a charged particle microscopic image of a test structure 500 with sub-threshold leakage in accordance with an embodiment of the present invention. As illustrated in FIG. 6B, the grounded gates 512, 514, 520, 522, etc. or say gate plugs 5121, 5141, 5201 and 5221 still display a BVC. Again as described earlier, the gate potential/gate voltage on gate 512, 514, 520, 522, etc. is lower than their corresponding threshold voltages during charged particle beam inspection. For example, this concerned gate voltage may be substantially equal to zero (ground voltage) during charged particle beam inspection. However, in this embodiment the sub-threshold leakage is present in test structure 500, therefore an electrical current is allowed to flow across the channels between doped region 513, 515, 517, 519, 521, etc even the gate voltage of gate 512, 514, 520, 522, etc. is below the threshold voltage. As a result, these doped regions display a BVC as shown in FIG. 6B. Doped region 513/511, as is shorted (grounded), still displays a BVC in FIG. 6B. Alternatively speaking, the grounded plug 5131 in FIG. 5C displays a BVC, while other non-grounded plugs 5151, 5171, 5191, 5211, etc. in FIG. 5C also display a BVC due to the presence of the sub-threshold leakage defect in test structure 500.

As mentioned earlier the sub-threshold leakage typically exists as a systematic defect, therefore when it is present in test structure 500 most of the doped regions therein would be defective and the entire row of transistors in test pattern 510 may be observed to be displaying a BVC. As a result, from the inspection point of view, if the number of the consecutive doped regions (or say the plugs connected thereto) in test pattern 510 display an abnormal VC (BVC in this case) exceeds a predefined threshold value, it is determined that a sub-threshold leakage defect is present in test structure 500.

Figure 7A:
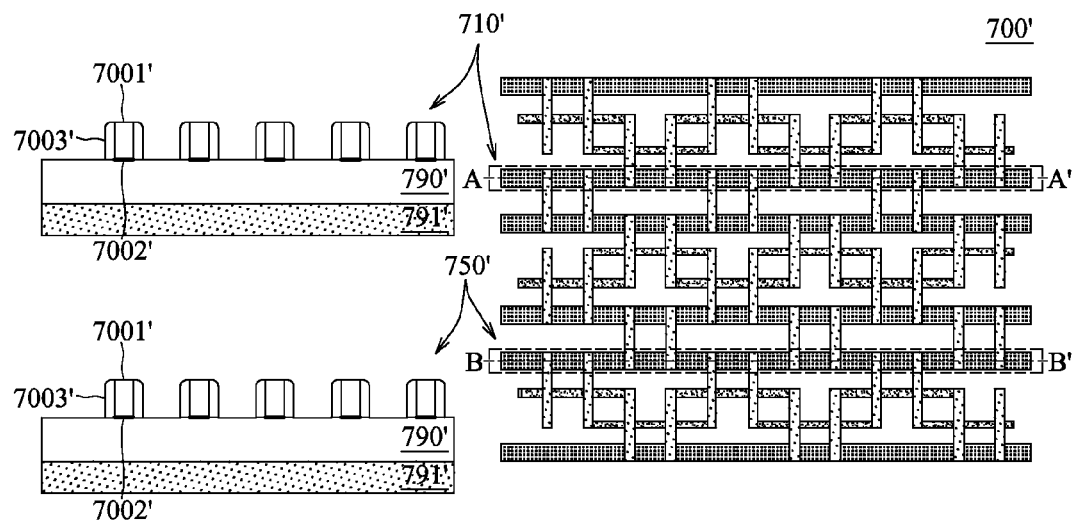
FIG. 7A is a schematic illustration of a pre-implantation test structure in accordance with an embodiment of the present invention.

In one embodiment, a method for fabricating a test structure by modifying a conventional SRAM device is disclosed. The modification is achieved by adjusting a coverage area of a photolithography mask for forming source/drain doped regions of a transistor by ion implantation. Referring to FIG. 7A, which is a schematic illustration of a pre-implantation test structure 700' in accordance with an embodiment of the present invention. Pre-implantation test structure 700' is to form a test structure 700 by undergoing an ion implantation process. The right hand side drawing is a top view schematic illustration of pre-implantation test structure 700', while the left hand side drawings are a cross sectional schematic illustration of two patterns to be formed in the final test structure 700. As shown, pre-implantation test structure 700' comprises a similar layout to a general SRAM device. In design, pre-implantation test structure 700' is provided with at least one pre-implantation test pattern 710'. As shown, pre-implantation test pattern 710' has a structure substantially identical to other, if existing, pre-implantation normal patterns 750' in test structure 700'. As would be understood by those skilled in the art, such structure is common in semiconductor devices and at least comprises a substrate 791', a well 790', a gate electrode 7001' formed over well 790', a gate dielectric layer 7002' formed between gate electrode 7001' and well 790', and a sidewall spacer 7003' formed on the sidewalls of gate electrode 7001'. Note that it is by the side of gate electrodes 7001' where the source and drain doped regions are to be subsequently formed by ion implantation. In one embodiment, substrate 791' comprises a p-type doped substrate, and well 790' comprises a p-type doped well. In the same embodiment, an n-type dopant is to be implanted to form the source/drain doped regions.

Figure 7B:
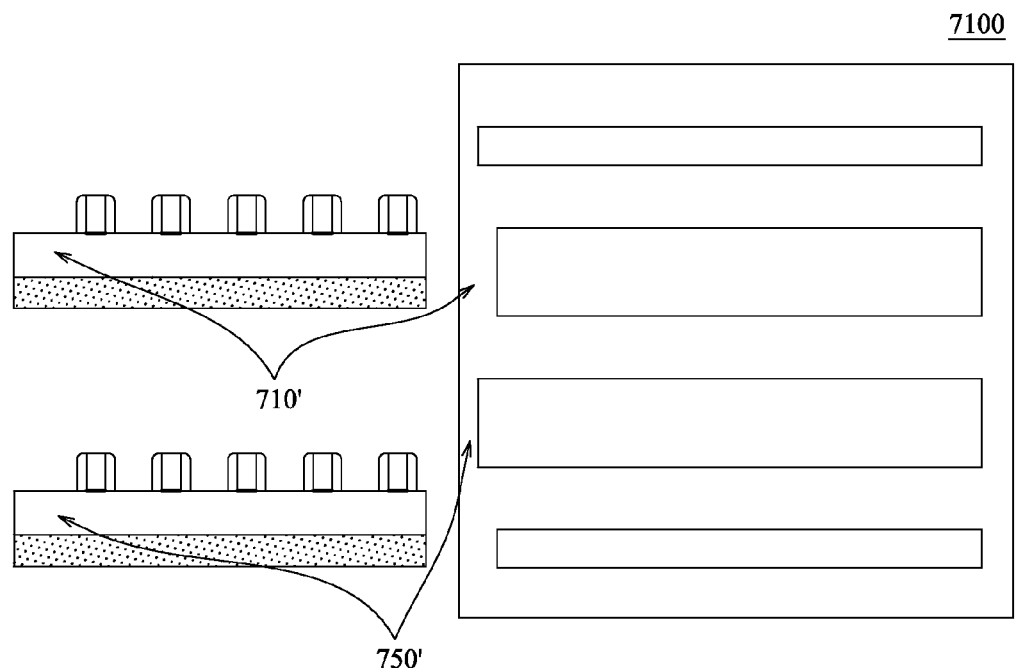
FIG. 7B is a schematic illustration of an ion implantation process for fabricating a test structure for sub-threshold leakage detection in accordance with an embodiment of the present invention.

FIG. 7B is a schematic illustration of an ion implantation process for fabricating a test structure for sub-threshold leakage detection in accordance with an embodiment of the present invention. The right hand side drawing is a top view schematic illustration of a modified source/drain ion implantation mask 7100, while the left hand side drawings are a cross sectional schematic illustration of two patterns in test structure 700' before being implanted by using mask 7100. As shown, in mask 7100 the uncovered (transparent) area for the implantation on test pattern 710' is designed to be shorter at one end, while that for normal pattern 750' is in full size.

Figure 7C:
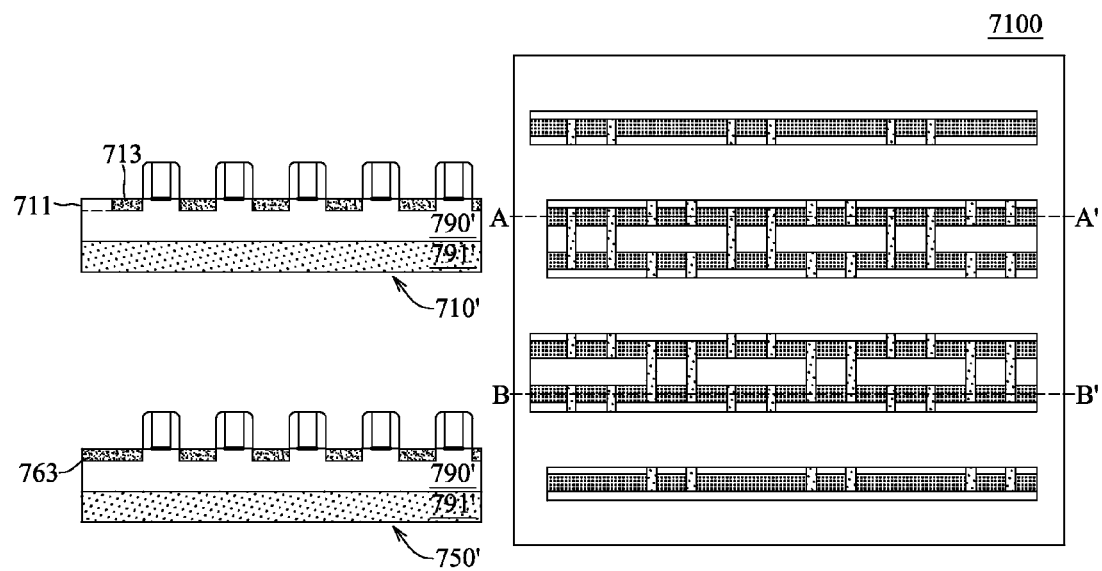
FIG. 7C is a schematic illustration of an ion implantation process continued from FIG. 7B.

Referring to FIG. 7C, which is a schematic illustration of an ion implantation process continued from FIG. 7B. The right hand side drawing is a top view schematic illustration of ion implantation mask 7100 being in use, while the left hand side drawings are a cross sectional schematic illustration of the two patterns in pre-implantation test structure 700' after being implanted by using mask 7100. In particular, the left hand side drawings are cross sectional illustrations of implanted test pattern 710' along line A-A' and normal pattern 750' along line B-B' in the right hand side drawing, respectively. Recall that mask 7100 is for forming the source/drain doped regions in both patterns 710' and 750'. As a result of the shortened uncovered area in mask 7100, the implanted test pattern 710' has an incomplete end doped region 711/713 which comprises an un-doped region 711 and a shorter doped region 713, with un-doped region 711 abutting doped region 713. The full size uncovered area portion of mask 7100 on the other hand, renders a full size end doped region 763 for normal pattern 750' in test structure 700'.

Figure 7D:
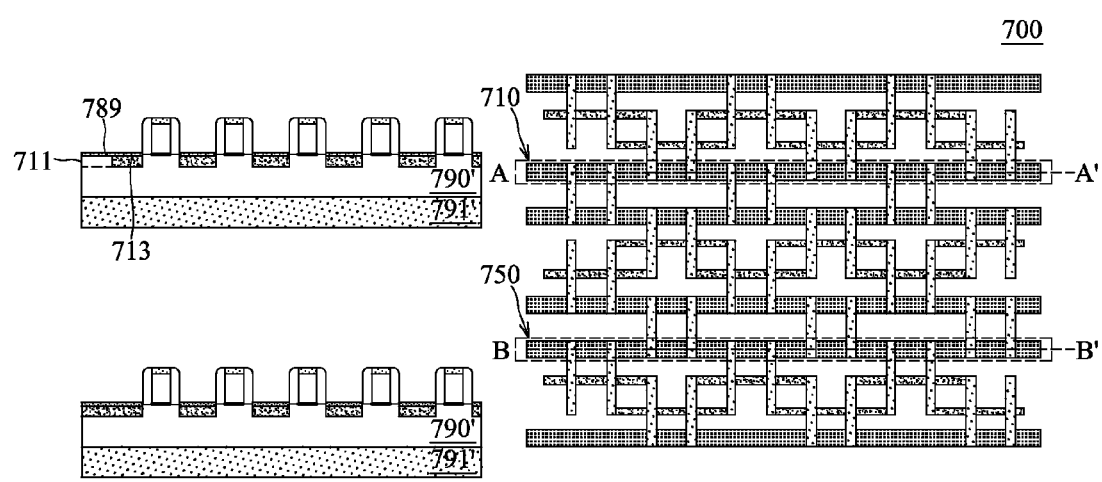
FIG. 7D is a schematic illustration of an ion implantation process continued from FIG. 7C.

Referring now to FIG. 7D, which is a schematic illustration of an ion implantation process continued from FIG. 7C. As shown, after implantation, a conductive layer 789 is formed on top of each formed doped region to complete the fabrication of a test pattern 700 (and also a normal pattern 750 and thus the desired test structure 700). The right hand side drawing is a top view schematic illustration of the fabricated test structure 700, while the left hand side drawings are a cross sectional schematic illustration of test pattern 710 along line A-A' and normal pattern 750 along line B-B' in the right hand side drawing, respectively.

It can be seen in FIG. 7D that doped region 713 and un-doped region 711 are commonly covered by a conductive layer 789. As a result, electrical conduction is allowed between doped region 713 and the underneath substrate materials including well 790' and substrate 791' through conductive layer 789, thereby rendering a grounding effect for doped region 713. Un-doped region 711 can thus be seen as a source-to-ground short defect which shorts doped region 713 to the ground (substrate 791'). In other words, test pattern 710 has been intentionally made defective by using the modified photolithography mask 7100 during ion implantation. In one embodiment, test pattern 710 and normal pattern 750 are implemented as an NMOSFET as that described in conjunction with FIG. 2A, wherein well 790 and substrate 791 comprises a p-type dopant, and all doped regions in both test pattern 710 and normal pattern 750 comprise an opposite n-type dopant. In one embodiment, well 790 is dispensed with and the electrical conduction is allowed directly between doped region 713 and substrate 791'.

Although the present invention has been explained in relation to its preferred embodiment, it is to be understood that other modifications and variation can be made without departing the spirit and scope of the invention as hereafter claimed.

What is claimed is:

1. A method for determining a sub-threshold leakage defect in a sample of semiconductor device, comprising:
    providing said sample with at least one test row of transistors, wherein at least one transistor in each said test row of transistor is rendered grounded;
        obtaining a charged particle microscopic image of said sample; and
        determining said sub-threshold leakage defect in said sample by monitoring the voltage contrast (VC) level of said test rows of transistors from said charged particle microscopic image.

2. The method of claim 1, wherein if a predefined number of consecutive transistors in any said test row of transistors meet a predefined voltage contrast level, it is determined that a sub-threshold leakage defect exists in said sample.

3. The method of claim 2, wherein said predefined voltage contrast level comprises the bright voltage contrast (BVC).

4. The method of claim 1, wherein said grounded transistor is rendered grounded by allowing electrical conduction between a doped region of said grounded transistor and a substrate.

5. The method of claim 4, wherein said allowing electrical conduction between said doped region and said substrate is achieved by adjusting the coverage area of an ion implantation mask for said doped region.

6. The method of claim 1, wherein said sub-threshold leakage defect comprises an electrical leakage between the source/drain regions of a transistor.

7. The method of claim 1, further comprising providing at least one normal row of transistors, all transistors in said normal row of transistors having source and drain regions with a dopant type opposite to that of said substrate, wherein said sub-threshold leakage defect is determined by comparing the voltage contrast (VC) level of said test and normal rows of transistors from said charged particle microscopic image.

8. The method of claim 7, wherein said source and drain regions have an n-type dopant and said substrate has a p-type dopant.

9. The method of claim 1, wherein said semiconductor device comprises static random access memory (SRAM).

10. A test structure for determining a sub-threshold leakage defect of a semiconductor device, comprising:
   at least one test row of transistors, at least one transistor in each said test row of transistors being rendered grounded,
   wherein said sub-threshold leakage defect is determined by monitoring the voltage contrast (VC) level of said test rows of transistors from a charged particle microscopic image of said sample.

11. The test structure of claim 10, wherein said grounded transistor is located at the end of said test row of transistors.

12. The test structure of claim 10, wherein said grounded transistor is rendered grounded by allowing electrical conduction between a doped region of said grounded transistor and a substrate.

13. The test structure of claim 12, wherein said allowing electrical conduction between said doped region and said substrate is achieved by adjusting the coverage area of an ion implantation mask for said doped region.

14. The test structure of claim 10, wherein at least a portion of the transistor gates in said test rows of transistors are virtually grounded by electrical connection to a capacitor of high volume capacitance.

15. The test structure of claim 14, wherein at least a portion of the transistor gates in said test rows of transistors are virtually grounded by electrical connection to a doped region having the same type of dopant as a substrate.

16. The test structure of claim 15, wherein said doped regions have a p-type dopant and said substrate has a p-type dopant.

17. The test structure of claim 10, further comprising providing at least one normal row of transistors, all transistors in said normal row of transistors having source and drain regions with a dopant type opposite to that of said substrate, wherein said sub-threshold leakage defect is determined by comparing the voltage contrast (VC) level of said test and normal rows of transistors from said charged particle microscopic image.

18. The test structure of claim 17, wherein said doped regions have an n-type dopant and said substrate has a p-type dopant.

19. The test structure of claim 17, wherein the transistors in said test and normal rows of transistors are NMOSFET transistors.

20. The test structure of claim 10, wherein said sub-threshold leakage defect comprises an electrical leakage between the source/drain regions of a transistor.

* * * * *